US012712025B2

(12) United States Patent
Suzuki et al.

(10) Patent No.: US 12,712,025 B2
(45) Date of Patent: Aug. 18, 2026

(54) SEMICONDUCTOR-MEMORY DEVICE

(71) Applicant: Renesas Electronics Corporation, Tokyo (JP)

(72) Inventors: Junichi Suzuki, Tokyo (JP); Tomoki Yamashina, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 167 days.

(21) Appl. No.: 18/825,268

(22) Filed: Sep. 5, 2024

(65) Prior Publication Data

US 2025/0087273 A1 Mar. 13, 2025

(30) Foreign Application Priority Data

Sep. 8, 2023 (JP) ................................ 2023-145828

(51) Int. Cl.

| | |
|---|---|
| ***G11C 16/12*** | (2006.01) |
| ***G11C 11/56*** | (2006.01) |
| ***G11C 16/04*** | (2006.01) |
| ***G11C 16/10*** | (2006.01) |
| ***G11C 16/24*** | (2006.01) |
| ***G11C 16/26*** | (2006.01) |
| ***G11C 16/30*** | (2006.01) |
| ***G11C 16/34*** | (2006.01) |

(52) U.S. Cl.

CPC .......... *G11C 16/12* (2013.01); *G11C 11/5628* (2013.01); *G11C 16/0483* (2013.01); *G11C 16/10* (2013.01); *G11C 16/24* (2013.01); *G11C 16/26* (2013.01); *G11C 16/30* (2013.01); *G11C 16/34* (2013.01)

(58) Field of Classification Search

CPC ..... G11C 16/12; G11C 16/24; G11C 11/5628; G11C 16/0483; G11C 16/10; G11C 16/26; G11C 16/30; G11C 16/34

See application file for complete search history.

(56) References Cited

U.S. PATENT DOCUMENTS

| | | | | |
|---|---|---|---|---|
| 7,915,666 | B2 | 3/2011 | Yasui et al. | |
| 2004/0088470 | A1 * | 5/2004 | Kawamura ............ | G11C 16/26 711/1 |
| 2021/0143260 | A1 * | 5/2021 | Hisamoto ............ | H10D 30/696 |

FOREIGN PATENT DOCUMENTS

| | | |
|---|---|---|
| JP | 2008-288503 A | 11/2008 |

* cited by examiner

*Primary Examiner* — Alexander Sofocleous
*Assistant Examiner* — Joseph Fidelis Stormes
(74) *Attorney, Agent, or Firm* — Rimon P.C.

(57) ABSTRACT

To reduce the time required for data writing. A semiconductor memory device is provided, comprising a memory cell having a gate electrode including a selection gate and a memory gate, a source line connected to a source, and a bit line connected to a drain, an extraction part that extracts a current flowing from the source side to the drain side during writing in the memory cell from the bit line, a discharge part that has a higher ability to pass current than the extraction part and lowers the voltage of the bit line, a charge part that has a higher ability to pass current than the discharge part and applies a voltage to the bit line, and a control part that, when starting to write to the memory cell, lowers the voltage of the bit line by the discharge part and applies a voltage to the bit line by the charge part.

6 Claims, 6 Drawing Sheets

SEMICONDUCTOR-MEMORY DEVICE

CROSS-REFERENCE TO RELATED APPLICATIONS

The disclosure of Japanese Patent Application No. 2023-145828 filed on Sep. 8, 2023, including the specification, drawings and abstract is incorporated herein by reference in its entirety.

BACKGROUND

This disclosure relates to a semiconductor memory device.

There are disclosed techniques listed below.

[Patent Document 1] Japanese Unexamined Patent Application Publication No. 2008-288503

Conventionally, a split gate type memory cell having a selection gate transistor and a memory gate transistor is known (for example, Patent Document 1). Such a memory cell is also referred to as SG-MONOS (Split Gate-Metal Oxide Nitride Oxide Silicon) because the gate electrode is divided into a selection gate and a memory gate. MONOS is a structure in which three layers of oxide film/nitride film (trap film)/oxide film are formed on a silicon substrate, and a gate electrode (metal) is placed thereon. SG-MONOS is used, for example, as a flash memory structure mounted on a microcontroller or the like.

SUMMARY

However, in the conventional technology, there is room for improvement in the time required for data writing. Other objects and novel features will become apparent from the description of this specification and the accompanying drawings.

In one embodiment, a semiconductor memory device is provided, which includes a memory cell having a gate electrode including a selection gate and a memory gate, a source line connected to a source, a bit line connected to a drain, a pull-out part that pulls out a current flowing from the source side to the drain side during writing in the memory cell from the bit line, a discharge part that has a higher ability to pass current than the pull-out part and lowers the voltage of the bit line, a charge part that has a higher ability to pass current than the discharge part and applies a voltage to the bit line, and a control part that, when starting writing to the memory cell, lowers the voltage of the bit line by the discharge part and applies a voltage to the bit line by the charge part.

According to the one embodiment, the time required for data writing can be reduced.

DETAILED DESCRIPTION

This disclosure is explained with reference to several exemplary embodiments. These embodiments are described for illustrative purposes only, and it should be understood that they are intended to assist those skilled in the art in understanding and implementing this disclosure, without suggesting any limitations on the scope of this disclosure. The disclosure described in this specification can be implemented in various ways other than those described below.

In the following description and in WHAT IS CLAIMED IS:, unless otherwise defined, all technical and scientific terms used in this specification have the same meaning as commonly understood by those skilled in the art to which this disclosure belongs.

Hereinafter, embodiments of the present invention will be described with reference to the drawings.

<Configuration>

Figure 1:
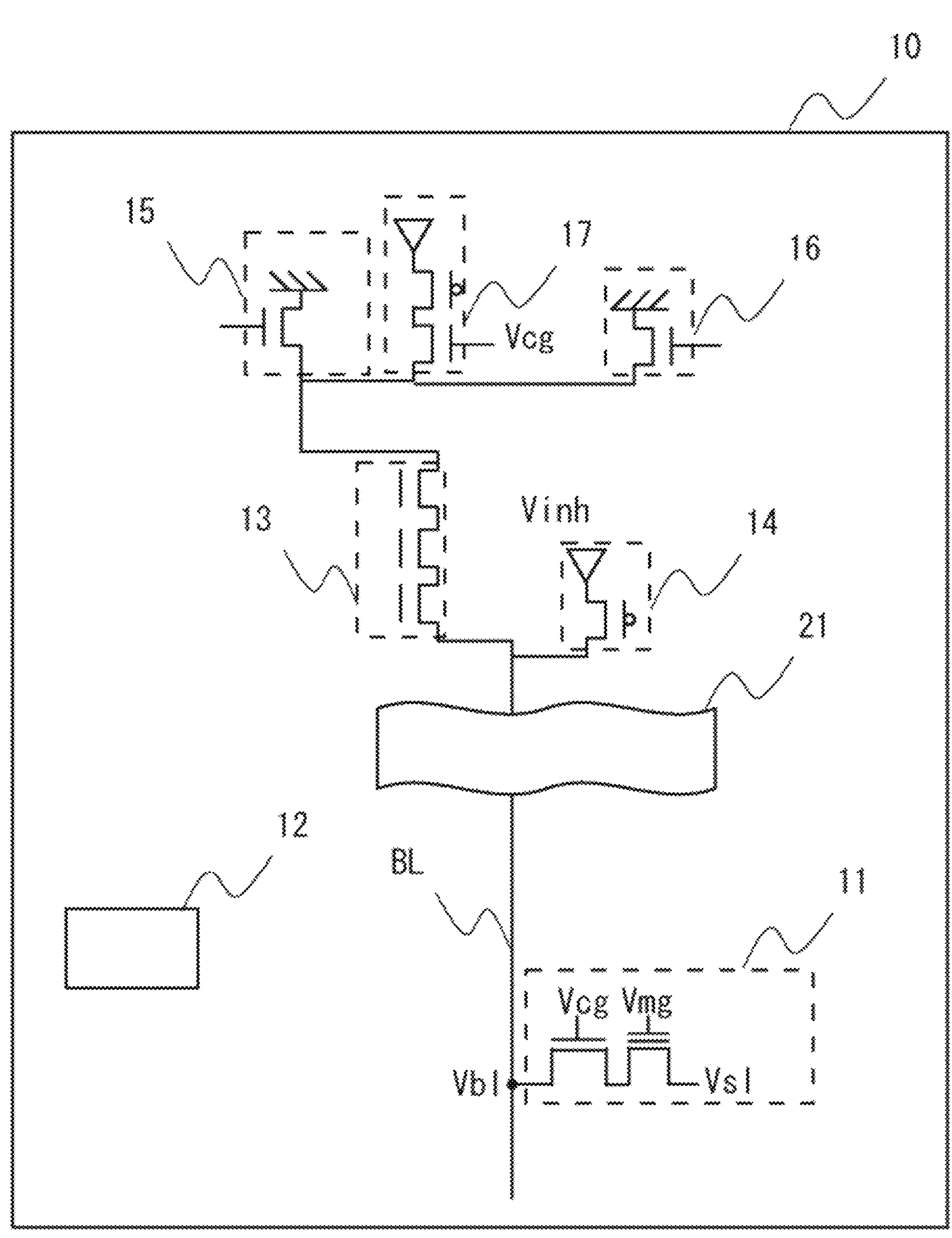
FIG. 1 is a block diagram showing an example of the configuration of a semiconductor memory device according to the embodiment.

Referring to FIG. 1, the configuration of a semiconductor memory device 10 according to this embodiment will be described. FIG. 1 is a diagram showing an example of the configuration of the semiconductor memory device 10 according to this embodiment. The semiconductor memory device 10 includes a memory cell 11, a control section 12, a switch 13, a bias section 14, a pull-out section 15, a discharge section 16, and a charge section 17. Note that FIG. 1 shows the elements necessary for the explanation of this disclosure, and the explanation of those with low relevance to the explanation of this disclosure is appropriately omitted. Therefore, for parts not shown in FIG. 1, as necessary, those used in known semiconductor memory devices (semiconductor memories) can be used.

The memory cell 11 is a circuit that performs functions such as data storage. The memory cell 11 may be a Multi-Level Cell (MLC) that can record more than one bit of information by having multiple levels of stored charge and taking three or more different states.

The memory cell 11 is connected to the bias section 14, the pull-out section 15, the discharge section 16, and the charge section 17 by the bit line BL. Although not shown in FIG. 1, as indicated by the repetitive FIG. 21, the semiconductor memory device 10 includes multiple bit lines and memory cells, with one memory cell connected to one bit line, and the memory cell to be controlled may be selected by the switch 13.

The control section 12 controls each part of the semiconductor memory device 10. For example, the control section 12 instructs each part of the semiconductor memory device 10 to perform the operations necessary for writing data to the memory cell 11. The control section 12 may control the operation of each part by controlling the voltage or signal, etc., applied to each input part of each part.

The bias section 14 is turned on at a specific point in the stage (Phase 1) before the start of data writing to the memory cell 11 is instructed by the control section 12, and applies a power supply voltage Vinh (for example, 1.5V) to the bit line BL. Also, the bias section 14 is turned off in the stage (Phase 2) after the start of data writing to the memory cell 11 is instructed by the control section 12, and stops applying voltage to the bit line BL.

The pull-out section 15 is turned off in Phase 1. Also, the pull-out section 15 is turned on in Phase 2, and pulls out the current Ids flowing from the source S side to the drain D side during writing in the memory cell 11 from the bit line BL at a constant current (for example, 1.3 μA). Therefore, the pull-out section 15 reduces the voltage Vbl on the bit line BL by the constant current.

The discharge section 16, for example, has an NMOS (n-type MOS (Metal-Oxide-Semiconductor)) transistor. The discharge section 16 has the ability to pass a current far higher than the Constant current (for example, 1.3 μA) that the pull-out section 15 passes when pulling out the voltage Vbl on the bit line BL, while the gate is at a high (H) level when a specific signal is input. Therefore, the discharge section 16 rapidly reduces the voltage Vbl on the bit line BL while a specific signal is input.

The charge section 17 operates as a source follower circuit (drain grounded circuit). The charge section 17 has the same mechanism (film thickness and injection conditions) as the selection gate CG of the memory cell 11 to be described later, and has an NMOS transistor (work gate (WG) poly transistor) larger in size than the selection gate CG.

The WG poly transistor may be formed by a method similar to the selection gate CG in order to have the same film thickness and injection conditions as the selection gate CG. The voltage (gate threshold voltage) at which the WG poly transistor starts to pass current is the same as the gate threshold voltage Vtm of the selection gate CG.

The WG poly transistor may have a different size and current passing ability (current capacity) compared to the selection gate CG. The WG poly transistor has the ability to pass a higher current than the discharge section 16. Therefore, if the current capacity of the charge section 17 is CAc, the current capacity of the discharge section 16 is CAd, and the current capacity of the pull-out section 15 is CAh, the following inequality (1) holds. CAc>CAd>>CAh . . . (1)

The charge section 17 is connected to the bit line BL with the WG poly transistor and a PMOS transistor that operates as a switch arranged in series. The same voltage as the voltage Vcg of the selection gate CG during writing to the memory cell 11 is applied from the power source to the charge section 17. Furthermore, since the gate threshold voltage of the WG poly transistor is Vtm, when the charge section 17 is turned on, a voltage of approximately Vcg-Vtm is applied to the bit line BL.

<About Memory Cell 11>

<<Configuration of Memory Cell 11>>

Figure 2:
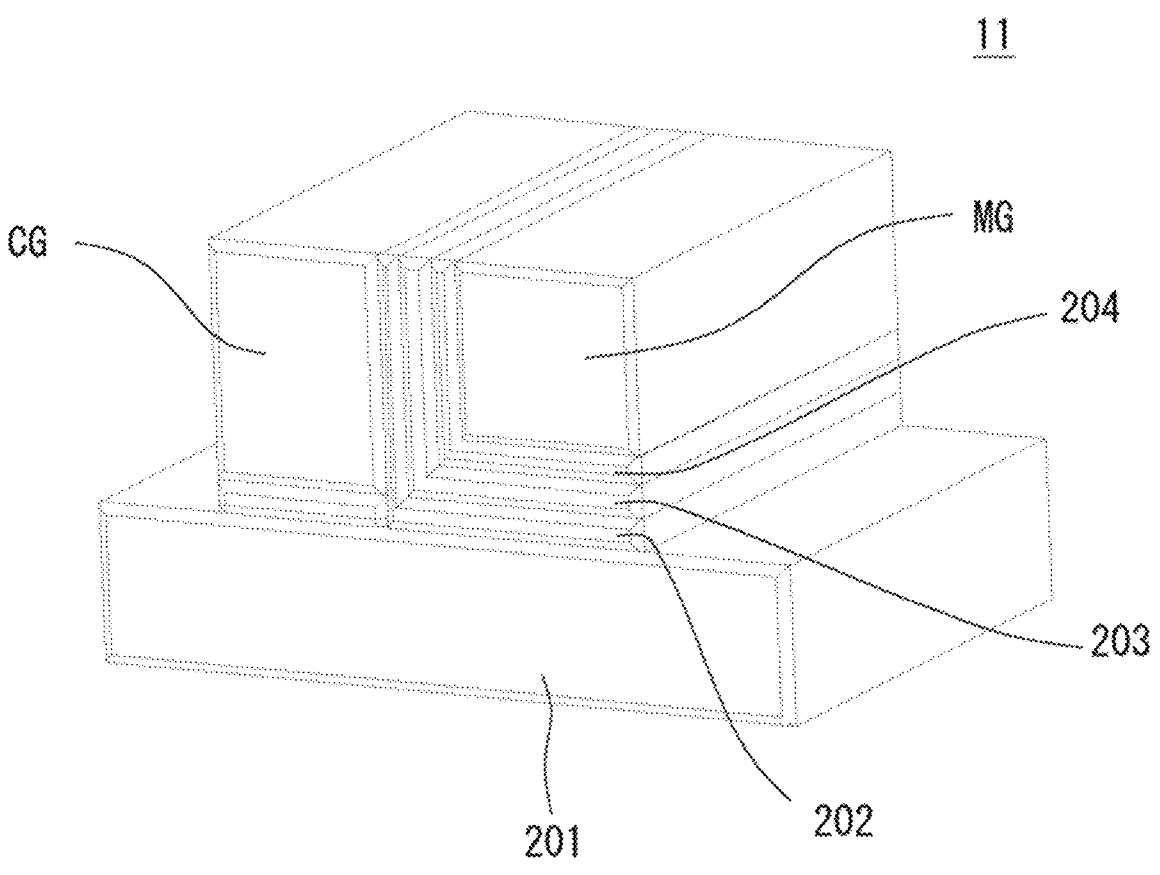
FIG. 2 is a diagram showing an example of the configuration of a memory cell according to the embodiment.

Next, referring to FIG. 2, the configuration of the memory cell 11 will be described, FIG. 2 is a diagram showing an example of the configuration of the memory cell 11 according to the embodiment. In the example of FIG. 2, the memory cell 11 has three layers of oxide film 202/nitride film (trap film) 203/oxide film 204 formed on the silicon substrate 201, and a gate electrode (metal), which is a memory gate MG, is arranged thereon. Then, a high-density electron capture level is formed in the nitride film 203.

Such a structure is also referred to as MONOS (Metal Oxide Nitride Oxide Silicon) and the like. Also, in the example of FIG. 2, the gate electrode is divided into a selection gate CG and a memory gate MG. Such a gate electrode is also referred to as SG (Split Gate). Therefore, the memory cell 11 as shown in FIG. 2 is also referred to as SG-MONOS, and is used, for example, in embedded flash memory for microcontrollers.

<<Operation of Memory Cell 11 During Writing>>

Figure 3:
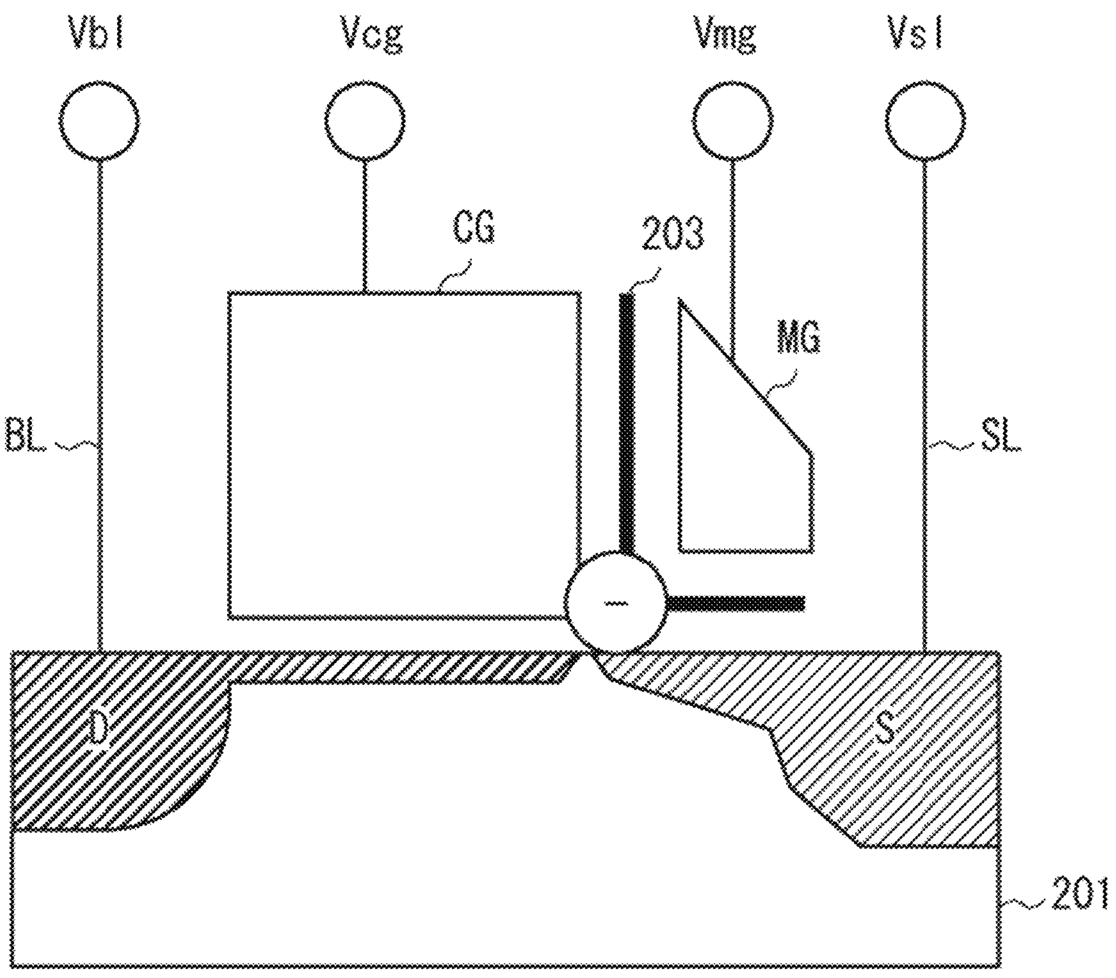
FIG. 3 is a diagram showing an example of the operation during writing of a memory cell according to the embodiment.

Next, referring to FIG. 3, the operation of the memory cell 11 during writing will be described. FIG. 3 is a diagram showing an example of the operation of the memory cell 11 during writing according to the embodiment. In the example of FIG. 3, a positive high voltage (for example, 10V) is applied as the voltage Vmg of the memory gate MG, and a positive high voltage (for example, 5V) is applied as the voltage Vsl of the source line SL connected to the source S on the silicon substrate 201. Also, a positive voltage (for example, 1V) is applied as the voltage Vcg of the selection gate CG. Also, a positive voltage (for example, 0.7V) is applied as the voltage Vbl of the bit line BL connected to the drain D on the silicon substrate 201.

By applying a high voltage to the voltage Vmg and the voltage Vsl, hot electrons are injected from the silicon substrate 201 into the nitride film 203. This hot electron injection technology is also referred to as SSI (Source Side Injection).

Here, the control section 12 maintains the voltage of the bit line BL at about Vcg-Vtm by limiting the current of the bit line BL to a constant current (for example, 1.3 μA). Vtm is the voltage (gate threshold voltage) at which the selection gate CG starts to pass current. Also, Vcg-Vtm is the voltage that the selection gate CG is applying to the bit line BL. As a result, a current Ids (for example, about 1 to 4 μA) flows from the source S side to the drain D side, and writing is performed by hot electron injection. The current Ids from the source S side to the drain D side is drawn out from the bit line BL at a constant current (for example, 1.3 μA) by the pull-out section 15.

<<Operation of Memory Cell 11 During Reading>>

During the reading of the memory cell 11, the voltage Vmg and the voltage Vsl are set to, for example, 0V, and a positive voltage (for example, 1.5V and 1.25V, respectively) is applied to the voltage Veg and the voltage Vbl.

<<Operation of Memory Cell 11 During Erasure>>

When erasing the data of the memory cell 11, the voltage Vcg and the voltage Vbl are set to 0V, and a negative high voltage is applied to the voltage Vmg and a positive high voltage is applied to the voltage Vsl. This effectively lowers the energy barrier of the insulating film, and holes tunnel from the silicon substrate 201 to the nitride film 203. Then, the electrons at the capture level recombine with the holes and disappear, so the stored charge disappears.

<Operation During Writing of Semiconductor Memory Device 10>

Figure 4:
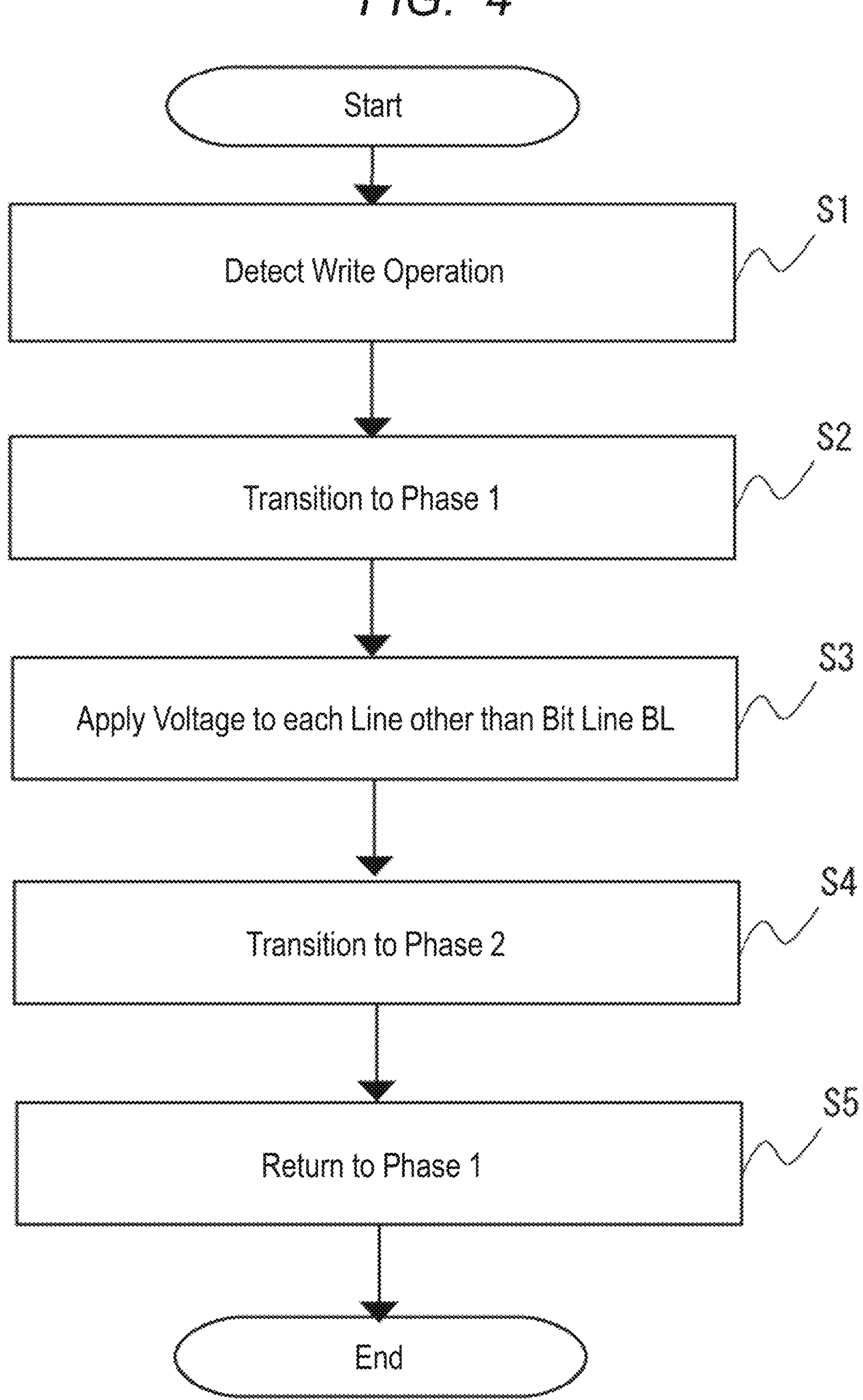
FIG. 4 is a flowchart showing an example of the operation of writing to a memory cell of a semiconductor memory device according to the embodiment.
Figure 5:
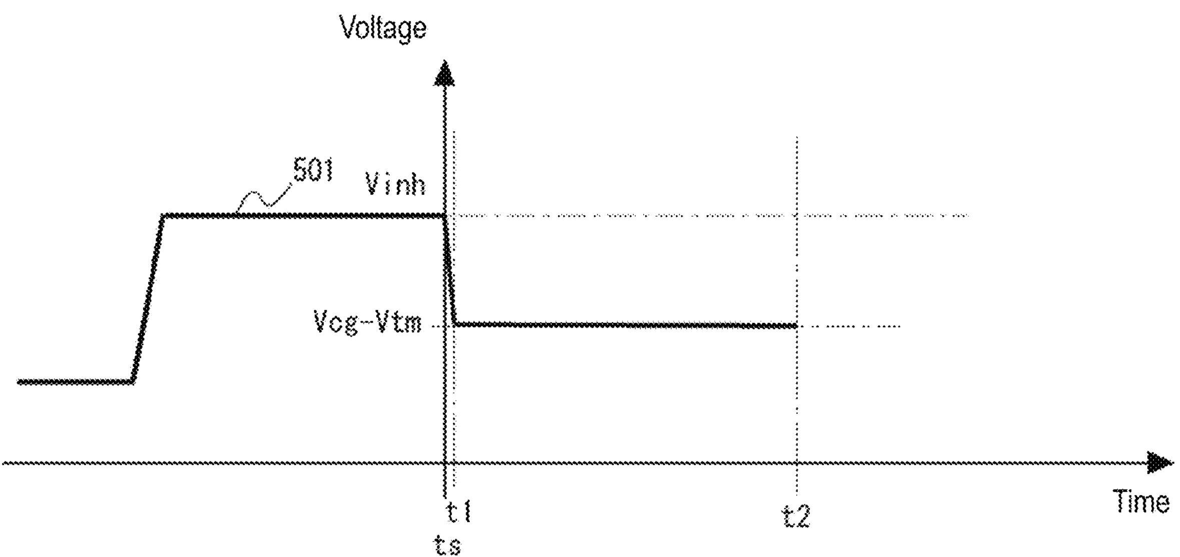
FIG. 5 is a time series chart showing an example of the voltage on the bit line during writing according to the embodiment.

Next, referring to FIGS. 4 and 5, the operation during writing to the memory cell 11 of the semiconductor memory device 10 will be described. FIG. 4 is a flowchart showing an example of the operation during writing to the memory cell 11 of the semiconductor memory device 10 according to the embodiment. FIG. 5 is a time-series chart showing an example of the voltage Vbl on the bit line BL during writing according to the embodiment. The processing steps in FIG. 4 can be changed as appropriate as long as they do not contradict each other.

In step S1, the control unit 12 detects a write operation to the memory cell 11. Here, the control unit 12 may determine the memory cell 11 to be written to, for example, when it receives a write instruction from an external microcontroller or the like.

Next, the control unit 12 transitions each part of the semiconductor memory device 10 to phase 1, which is also a preparatory stage before the start of writing (step S2). Here, the control unit 12 turns on the bias unit 14 and applies a power supply voltage Vinh (for example, 1.5V) to the bit line BL. Also, the control unit 12 turns off the pull-out unit 15 to prevent the voltage Vbl on the bit line BL from dropping. As a result, as shown in the transition 501 of the voltage Vbl on the bit line BL in FIG. 5, the voltage Vbl is set to the voltage Vinh before the time point ts. If each part of the semiconductor memory device 10 is already in the state of phase 1, the processing of step S2 (the processing to transition to phase 1) is unnecessary.

Next, the control unit 12 applies a voltage to each line other than the bit line BL of the memory cell 11 (step S3). Here, the control unit 12 applies a positive high voltage (for example, 10V) as the voltage Vmg of the memory gate MG, and applies a positive high voltage (for example, 5V) as the voltage Vsl of the source line SL. Also, the control unit 12 applies a positive voltage (for example, 1V) as the voltage Vcg of the select gate CG.

Next, the control unit 12 transitions to phase 2, which is a stage after the start of writing, by instructing the start of data writing to the memory cell 11 (step S4). Here, the control unit 12 turns off the bias unit 14 and stops applying voltage to the bit line BL. Also, the control unit 12 turns on the pull-out unit 15 and causes the voltage Vbl on the bit line BL to be pulled out (lowered) by a constant current (for example, 1.3 μA).

In addition, the control unit 12 inputs a pulse signal (one-shot signal) of a specific time length (width) to the discharge unit 16 and (almost simultaneously) turns on the charge unit 17 for a specific time length. As a result of the one-shot signal being input to the discharge unit 16, the voltage Vbl on the bit line BL drops sharply (at once) from the power supply voltage Vinh. This is because the current capacity CAd of the discharge unit 16 is much higher than the current capacity CAh of the pull-out unit 15 (CAd>>CAh).

Also, by turning on the charge unit 17, a path is created that applies a voltage of about Vcg-Vtm to the bit line BL. As a result, while the charge unit 17 is turned on, when the voltage Vbl on the bit line BL drops to about Vcg-Vtm, current is supplied to the bit line BL from the WG poly transistor. Here, because the current capacity CAc of the charge unit 17 is higher than the current capacity CAd of the discharge unit 16 (CAc>CAd), the voltage Vbl on the bit line BL quickly stabilizes to about Vcg-Vtm. This can reduce undershoot.

As shown in the transition 501 of the voltage Vbl on the bit line BL in FIG. 5, between the time point ts when the start of data writing to the memory cell 11 is instructed and the time point t1, the voltage Vbl rapidly drops from the voltage Vinh to about Vcg-Vtm and then stabilizes.

When the voltage Vbl on the bit line BL becomes about Vcg-Vtm, in the memory cell 11, current flows from the source S side to the drain side, and writing actually starts by hot electron injection. In the example of FIG. 5, writing is performed by hot electron injection between time points t1 and t2.

Next, the control unit 12 returns to phase 1 by instructing the end of data writing to the memory cell 11 (step S5). Furthermore, the control unit 12 may sequentially execute the processing from step S2 onwards for each address of one or more memory cells that were targeted for writing among the plurality of memory cells of the semiconductor memory device 10.

<Other>

An explanation will be given for the case of a form that does not have a discharge unit 16 and a charge unit 17 compared to the configuration of this disclosure shown in FIG. 1. In this form, it takes about 1 microsecond from the time ts when the start of writing data to the memory cell 11 is instructed until the time t2 when the writing is completed by hot electron injection. Of these, for example, it takes about 500 nanoseconds to lower the voltage Vbl on the bit line BL to about Vcg-Vtm from the power supply voltage Vinh by the extraction unit 15, which mainly serves to extract a constant current from the bit line BL during writing.

Next, an explanation will be given for the case of a form that does not have a charge unit 17 compared to the configuration of this disclosure shown in FIG. 1. In this form, since the target voltage Vcg-Vtm and the one-shot signal have PVT (Process-Voltage-Temperature) dependence, it is relatively difficult to set to the target voltage by the discharge unit 16.

On the other hand, according to this disclosure, the voltage Vbl on the bit line BL can be set to the target voltage Vcg-Vtm quickly and appropriately by the discharge unit 16 and the charge unit 17. Therefore, the writing of data to the memory cell 11 can be speeded up. In particular, stable writing and speedup in MLC, where the writing time tends to be shortened by continuous writing operation, can be achieved.

Modified Example

Figure 6:
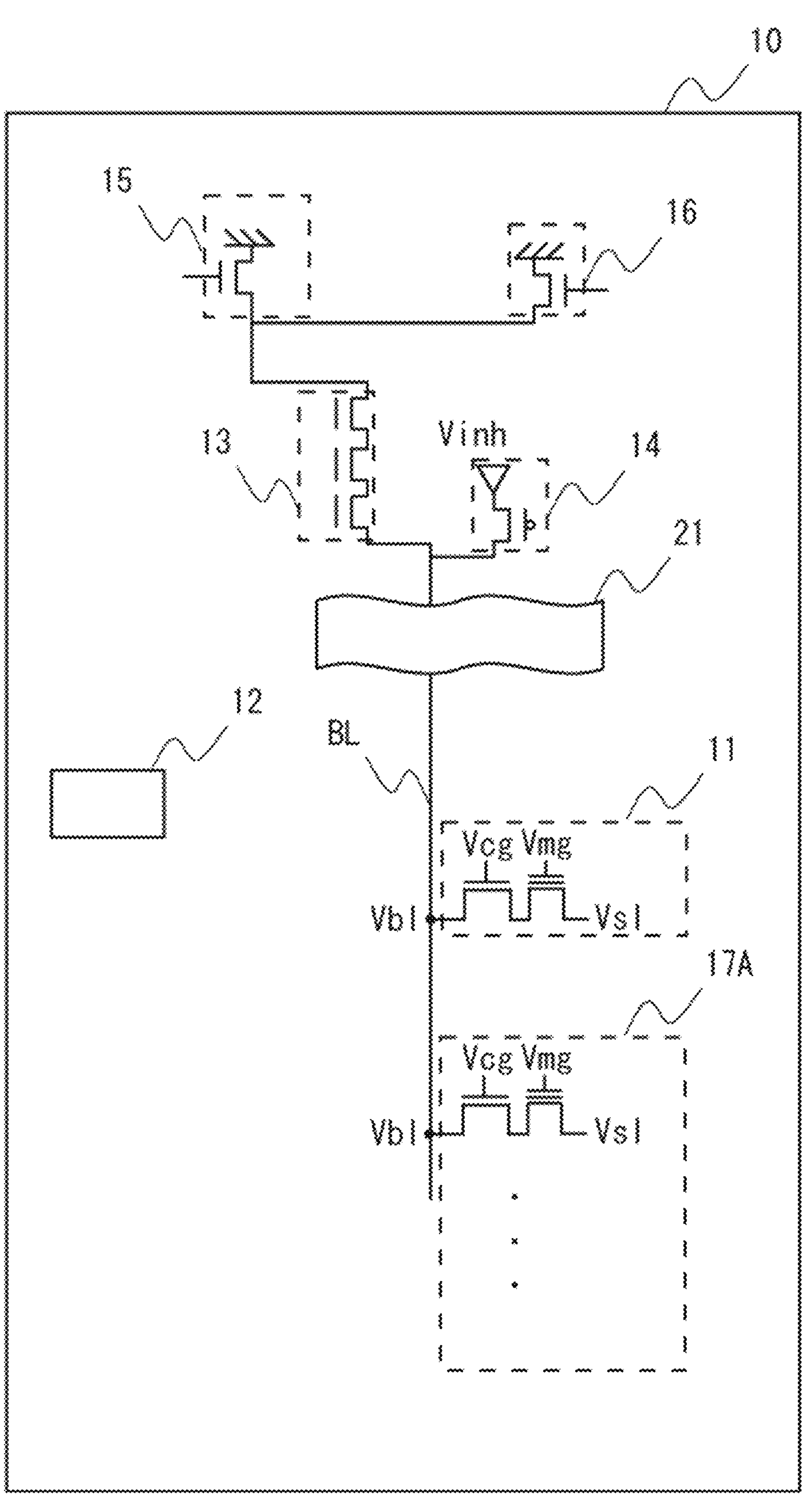
FIG. 6 is a block diagram showing an example of the configuration of a semiconductor memory device according to the embodiment.

In the example of FIG. 1, an explanation was given for the configuration in which one charge unit 17 is provided for a plurality of bit lines. Referring to FIG. 6, an explanation will be given for the configuration in which one charge unit 17A is provided for each bit line. FIG. 6 is a block diagram showing an example of the configuration of a semiconductor memory device according to an embodiment.

In the example of FIG. 1, the WG poly transistor of the charge unit 17 needs to be larger than the selection gate CG of the memory cell 11 because it is shared by a plurality of memory cells. Therefore, even if the WG poly transistor of the charge unit 17 is produced by the same method as the selection gate CG, there is a possibility that the characteristics may be subtly different due to the size being larger than the selection gate CG.

In the example of FIG. 6, the difference in characteristics due to different sizes can be reduced because the same thing as the memory cell 11 can also be used as a part of the charge unit 17A. In the example of FIG. 6, compared to the example of FIG. 1, n dummy cells are provided for each of one or more bit lines, so the size of the entire semiconductor memory device 10 may increase.

Configuration of Modified Example

In FIG. 6, the same reference numerals are used for the same configuration as in FIG. 1 to avoid duplication of same explanation. Hereinafter, mainly different parts from those in FIG. 1 in the configuration and operation in FIG. 6 will be explained.

In the example of FIG. 6, unlike the example of FIG. 1, it has a charge unit 17A that is connected to the bit line BL without going through the switch 13, instead of the charge unit 17 that is connected to the bit line BL through the switch 13.

The charge unit 17A has the same mechanism as the memory cell 11 and has n (multiple) dummy cells that are not used for data recording. Here, by having n dummy cells, the current capacity CAc' of the charge unit 17A is higher than the current capacity CAd of the discharge unit 16 (CAc'>CAd). Therefore, the following inequality (2), which is the same as in the example of FIG. 1, holds.

CAc'>CAd>>CAh . . . (2)

The current capacity CAh of the extraction unit 15 is equal to the current Ids (for example, 1.3 μA) flowing from the source S side to the drain D side during writing of the memory cell 11, so CAc'=CAh×n.

Operation of Modified Example

The operation of the modified example differs in the processing at step S4 in FIG. 4 when transitioning to phase 2, compared to the operation of the example in FIG. 1. In the modified example, at step S4 in FIG. 4, the control unit 12 inputs a pulse signal (one-shot signal) of a specific time length (width) to the discharge unit 16 and (almost simultaneously) turns on the charge unit 17A for a specific time length.

By turning on the charge unit 17A, a path is created that allows a voltage of about Vcg-Vtm to be applied to the bit line BL. As a result, while the charge unit 17A is turned on, if the voltage Vbl on the bit line BL drops to about Vcg-Vtm, current is supplied to the bit line BL from n dummy cells.

As in the example of FIG. 1, the current capacity CAc' of the charge unit 17A is higher than the current capacity CAd of the discharge unit 16 (CAc'>CAd), which rapidly stabilizes the voltage Vbl on the bit line BL to about Vcg-Vtm. This can reduce undershoot.

Although the invention made by the inventor has been specifically described based on the embodiment, the present invention is not limited to the embodiment already described, and it is needless to say that various modifications can be made without departing from the gist thereof.

What is claimed is:

1. A semiconductor memory device comprising:

a memory cell having a gate electrode including a select gate and a memory gate, a source line connected to a source, and a bit line connected to a drain;

a pull-out circuit configured to pull out a current flowing from the source side to the drain side during writing in the memory cell from the bit line;

a discharge circuit configured to pass a current higher than the pull-out circuit and to decrease the voltage of the bit line;

a charge circuit configured to pass a higher current passing ability than the discharge part and applies a voltage to the bit line; and a control circuit configured to, when starting to write to the memory cell, decreases the voltage of the bit line by the discharge circuit and applies a voltage to the bit line by the charge circuit.

2. The semiconductor memory device according to claim 1, wherein the control circuit is configured to applies a power supply voltage to the bit line before starting to write to the memory cell, and when starting to write to the memory cell, configured to stop applying the power supply voltage to the bit line, and configured to set the voltage of the bit line by the discharge circuit and the charge circuit to a value corresponding to the value obtained by subtracting the gate threshold voltage of the select gate from the voltage applied to the select gate.

3. The semiconductor memory device according to claim 1, wherein the charge circuit comprises the same gate threshold voltage as the select gate and applies the same voltage to the bit line as the voltage applied by the select gate to the bit line.

4. The semiconductor memory device according to claim 3, wherein the charge circuit comprises the same mechanism as the select gate and comprises a larger NMOS transistor than the select gate.

5. The semiconductor memory device according to claim 3, wherein the charge circuit comprises the same mechanism as the memory cell and comprises multiple dummy cells that are not used for data recording.

6. The semiconductor memory device according to claim 1, wherein the memory cell comprises multiple stages set for the charge to be stored, and comprises a multi-level cell configured to record more than one bit of information by taking three or more different states.

* * * * *